United States Patent
Cloud

(10) Patent No.: US 9,668,045 B1
(45) Date of Patent: May 30, 2017

(54) INTEGRATED PHANTOM-POWERED JFET CIRCUIT MODULE IN PORTABLE ELECTRONIC DEVICE FOR CREATING HI-FIDELITY SOUND CHARACTERISTICS

(71) Applicant: Rodger Cloud, Tucson, AZ (US)

(72) Inventor: Rodger Cloud, Tucson, AZ (US)

( * ) Notice: Subject to any disclaimer, the term of this patent is extended or adjusted under 35 U.S.C. 154(b) by 0 days.

(21) Appl. No.: 14/852,618

(22) Filed: Sep. 13, 2015

Related U.S. Application Data

(60) Continuation-in-part of application No. 13/655,840, filed on Oct. 19, 2012, now Pat. No. 9,306,519, and a continuation-in-part of application No. 13/854,839, filed on Apr. 1, 2013, now Pat. No. 9,167,327, and a continuation-in-part of application No. 14/158,863, filed on Jan. 19, 2014, now Pat. No. 9,210,508, said application No. 13/854,839 is a division of application No. 12/901,522, filed on Oct. 9, 2010, now Pat. No. 8,433,090.

(60) Provisional application No. 61/250,001, filed on Oct. 9, 2009.

(51) Int. Cl.
*H04R 3/00* (2006.01)
*H03F 1/02* (2006.01)
*H03F 3/185* (2006.01)

(52) U.S. Cl.
CPC .............. *H04R 3/00* (2013.01); *H03F 1/0211* (2013.01); *H03F 3/185* (2013.01); *H03F 2200/03* (2013.01); *H04R 2420/09* (2013.01)

(58) Field of Classification Search
CPC ..... H04R 3/00; H04R 2420/09; H03F 1/0211; H03F 3/185; H03F 2200/03

USPC ............................ 381/91, 122, 120, 113–115
See application file for complete search history.

(56) References Cited

U.S. PATENT DOCUMENTS

| | | | | |
|---|---|---|---|---|
| 5,216,379 A | * | 6/1993 | Hamley | H03F 1/0266 330/134 |
| 7,848,532 B2 | * | 12/2010 | Akino | H04R 1/04 381/111 |
| 8,466,529 B2 | * | 6/2013 | Suzuki | H01L 27/14618 257/431 |
| 2010/0322440 A1 | * | 12/2010 | Chiu | H03F 1/26 381/120 |
| 2011/0085683 A1 | * | 4/2011 | Ejaz | H04R 19/04 381/174 |

(Continued)

*Primary Examiner* — Disler Paul
(74) *Attorney, Agent, or Firm* — Invent Capture, LLC.; Samuel S. Cho

(57) ABSTRACT

A novel phantom-powered JFET gain circuit that improves audio clarity and linearity, while reducing a high-gain burden, noise, and distortion from a sole usage of a conventional preamplifier, is disclosed. In one embodiment, the novel phantom-powered JFET gain circuit is encased as a standalone box that connects to a microphone on one end and a conventional preamplifier unit or another conventional audio processing unit on another end. In another embodiment, the novel phantom-powered JFET gain circuit is integrated into a portable electronic device or another consumer electronic device with a microphone to provide an earliest-stage gain in a microphone-captured audio signal processing pathway. Yet in another embodiment, the novel phantom-powered JFET gain circuit is integrated into a preamplifier unit and provides the earliest-stage gain in a microphone-captured audio signal processing pathway, prior to additional and conventional signal amplification by the preamplifier unit.

11 Claims, 15 Drawing Sheets

(56) References Cited

U.S. PATENT DOCUMENTS

2012/0140950 A1* 6/2012 Poulsen ............... H04R 29/004
381/94.1

* cited by examiner

Phantom-Powered JFET Gains Circuit Incorporation to Cell Phones, Laptop Computers, or Video Cameras Phantom-Powered JFET Gains Circuit Integrating an XLR Connection Interface with Switchable Microphone Power Phantom-Powered JFET Gains Circuit in a USB Unit with Microphone Power Phantom-Powered JFET Gains Circuit Integrated in a Wireless Receiver with Power Supply Capability

1300

Phantom-Powered JFET Gains Circuit Pass-Through Application Flowchart

Application Flowchart for Phantom-Powered JFET Gains Circuit with USB Microphone Interface Application Flowchart for JFET Gains Circuit Integrated in Video Camera / Handheld Recorder

US 9,668,045 B1

INTEGRATED PHANTOM-POWERED JFET CIRCUIT MODULE IN PORTABLE ELECTRONIC DEVICE FOR CREATING HI-FIDELITY SOUND CHARACTERISTICS

INCORPORATION BY REFERENCE

The present application incorporates U.S. Ser. No. 13/854,839 by reference. Furthermore, the present application is a continuation-in-part application of an earlier-filed US divisional application, U.S. Ser. No. 13/854,839, which was filed on Apr. 1, 2013, with the earliest priority date of Oct. 9, 2009 from a U.S. provisional application, 61/250,001.

In addition, the present application also incorporates U.S. Ser. No. 13/655,840 by reference. Moreover, the present application is also a continuation-in-part application of an earlier-filed US non-provisional application, U.S. Ser. No. 13/655,840, which was filed on Oct. 19, 2012.

Furthermore, the present application also incorporates U.S. Ser. No. 14/158,863 by reference. The present application is also a continuation-in-part application of an earlier-filed US non-provisional application, U.S. Ser. No. 14/158,863, which was filed on Jan. 19, 2014.

BACKGROUND OF THE INVENTION

Audio preamplifiers are important components in sound recording, reproduction, or audio for live concerts or events. In general, an audio preamplifier takes an electrical signal generated from a microphone or another sound source as an input, and further processes and amplifies this input signal to generate a desirable level of amplified electrical signal to other components such as main amplifiers, speakers, or recording equipment.

Preamplifiers take an important role in determining amplified and/or reproduced sound characteristics of the sound source, because it is generally the first actively-powered stage for the electrical signal generated from the microphone or another sound source, which are highly vulnerable to undesirable distortions or noise introduced during any amplification stages. For example, an undesirable introduction of distortions or noise at or before the preamplifier stage may be magnified by subsequent amplification stages, thereby making post-preamplifier stage correction difficult and exacerbating any problems from the preamplifier to recording equipment or a listener.

Various portable electronic devices in today's consumer electronics industry incorporate microphone-based audio recording capabilities. For example, a laptop computer, a smart phone, a video recorder, and other consumer electronic devices either integrate a microphone or connect to an external microphone to provide audio recording capabilities to consumers. Unfortunately, many consumer electronic devices today do not provide a professional-level hi-fidelity and linear recording characteristics for audio recording. Conventionally-integrated preamplifiers or amplifiers in consumer electronic devices often suffer from a poor signal-to-noise ratio and nonlinear recording characteristics. Unwanted distortions, noise, and/or nonlinear transformations of sound at an early amplification stage in the consumer electronic devices result in reduced recorded sound quality.

Therefore, it may be desirable to provide a novel pre-amplification gain circuit with a linear amplification and a high signal-to-noise ratio. Furthermore, it may be desirable to provide a novel pre-amplification gain circuit that is uniquely powered by a power source that also powers a microphone incorporated into or connected to a consumer electronic device. Moreover, it may also be desirable to provide a novel pre-amplification gain circuit that can be easily integrated into any consumer electronic devices that utilize an actively-powered microphone.

SUMMARY

Summary and Abstract summarize some aspects of the present invention. Simplifications or omissions may have been made to avoid obscuring the purpose of the Summary or the Abstract. These simplifications or omissions are not intended to limit the scope of the present invention.

In one embodiment of the invention, a phantom-powered JFET preamplifier gain circuit for a microphone is disclosed. This phantom-powered JFET preamplifier gain circuit comprises a first JFET with its gate terminal operatively connected to a positive signal input terminal, wherein the first JFET is operatively connected to a second JFET in cascode having a positive signal output terminal for the phantom-powered JFET preamplifier gain circuit; a third JFET with its gate terminal operatively connected to a negative signal input terminal, wherein the third JFET is operatively connected to a fourth JFET in cascode having a negative signal output terminal for the phantom-powered JFET preamplifier gain circuit; one or more resistors operatively connected to the first JFET and the third JFET within the phantom-powered JFET preamplifier gain circuit; and one or more gain-setting feed resistors external to the phantom-powered JFET preamplifier gain circuit, wherein the one or more gain-setting feed resistors are operatively connected to the positive signal output terminal or the negative signal output terminal of the phantom-powered JFET preamplifier gain circuit.

In another embodiment of the invention, an electronic device incorporating a phantom-powered JFET gain circuit coupled to a microphone is disclosed. The phantom power may be actual or simulated by an internal or external power supply. This electronic device comprises: a microphone internally or externally connected to the electronic device; a power supply unit internally or externally connected to the electronic device, wherein the power supply unit provides a phantom power to the microphone and to the phantom-powered JFET gain circuit in the electronic device; a first JFET with its gate terminal operatively connected to a positive signal input terminal, wherein the first JFET is operatively connected to a second JFET in cascode having a positive signal output terminal for the phantom-powered JFET gain circuit; a third JFET with its gate terminal operatively connected to a negative signal input terminal, wherein the third JFET is operatively connected to a fourth JFET in cascode having a negative signal output terminal for the phantom-powered JFET gain circuit; one or more resistors operatively connected to the first JFET and the third JFET within the phantom-powered JFET gain circuit; and one or more gain-setting feed resistors external to the phantom-powered JFET gain circuit, wherein the one or more gain-setting feed resistors are operatively connected to the positive signal output terminal or the negative signal output terminal of the phantom-powered JFET gain circuit.

BRIEF DESCRIPTION OF DRAWINGS

Implementations of the invention will become more apparent from the detailed description set forth below when taken in conjunction with the drawings, in which like elements bear like reference numerals.

DETAILED DESCRIPTION

Figure 1:
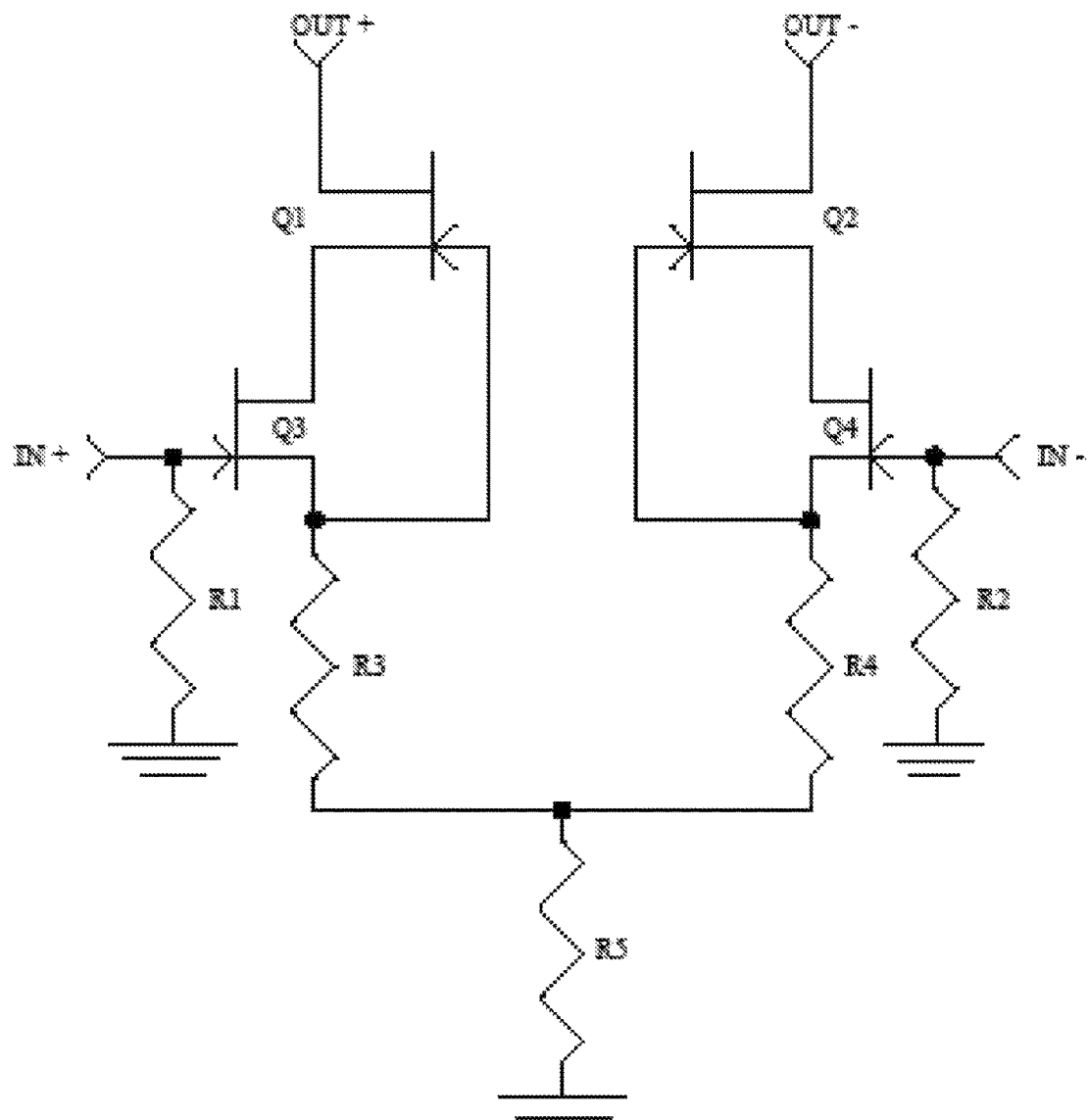
FIG. 1 shows a schematic of an embodiment of a phantom-powered differential cascode JFET preamplifier gain circuit, in accordance with an embodiment of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

The detailed description is presented largely in terms of description of shapes, configurations, and/or other symbolic representations that directly or indirectly resemble a phantom-powered JFET circuit, which may be incorporated in a standalone preamplifier unit or integrated into various consumer electronic devices that include or connect to an actively-powered microphone. For the present description, various embodiments of the invention are particularly related to one or more integrated phantom-powered JFET gain circuit modules in a portable electronic device for creating hi-fidelity sound characteristics. These process descriptions and representations are the means used by those experienced or skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment. Furthermore, separate or alternative embodiments are not necessarily mutually exclusive of other embodiments. Moreover, the order of blocks in process flowcharts or diagrams representing one or more embodiments of the invention do not inherently indicate any particular order nor imply any limitations in the invention.

Furthermore, a microphone embodying the present invention may further include a unique, phantom-powered differential cascode JFET (Junction Field Effect Transistor) preamplifier gain circuit. In general, conventional microphones do not incorporate phantom-powered differential cascodes. The phantom-powered differential cascodes disclosed in the present invention is novel and unique. Phantom power is a way of distributing DC current to provide power to a microphone. FIG. 1 illustrates a schematic of a novel phantom-powered differential cascode JFET preamplifier gain circuit in accordance with a preferred embodiment of the invention.

In a preferred embodiment of the invention, a first JFET (Q3) with its gate terminal operatively connected to a positive signal input terminal (IN+) is also operatively connected to a second JFET (Q1) in differential cascode, wherein the second JFET (Q1) has a positive signal output terminal (OUT+) for the phantom-powered JFET preamplifier gain circuit (100). Likewise, a third JFET (Q4) with its gate terminal operatively connected to a negative signal input terminal (IN−) is also operatively connected to a fourth JFET (Q2) in differential cascode, wherein the fourth JFET (Q2) has a negative signal output terminal (OUT−) for the phantom-powered JFET preamplifier gain circuit (100).

Figure 2:
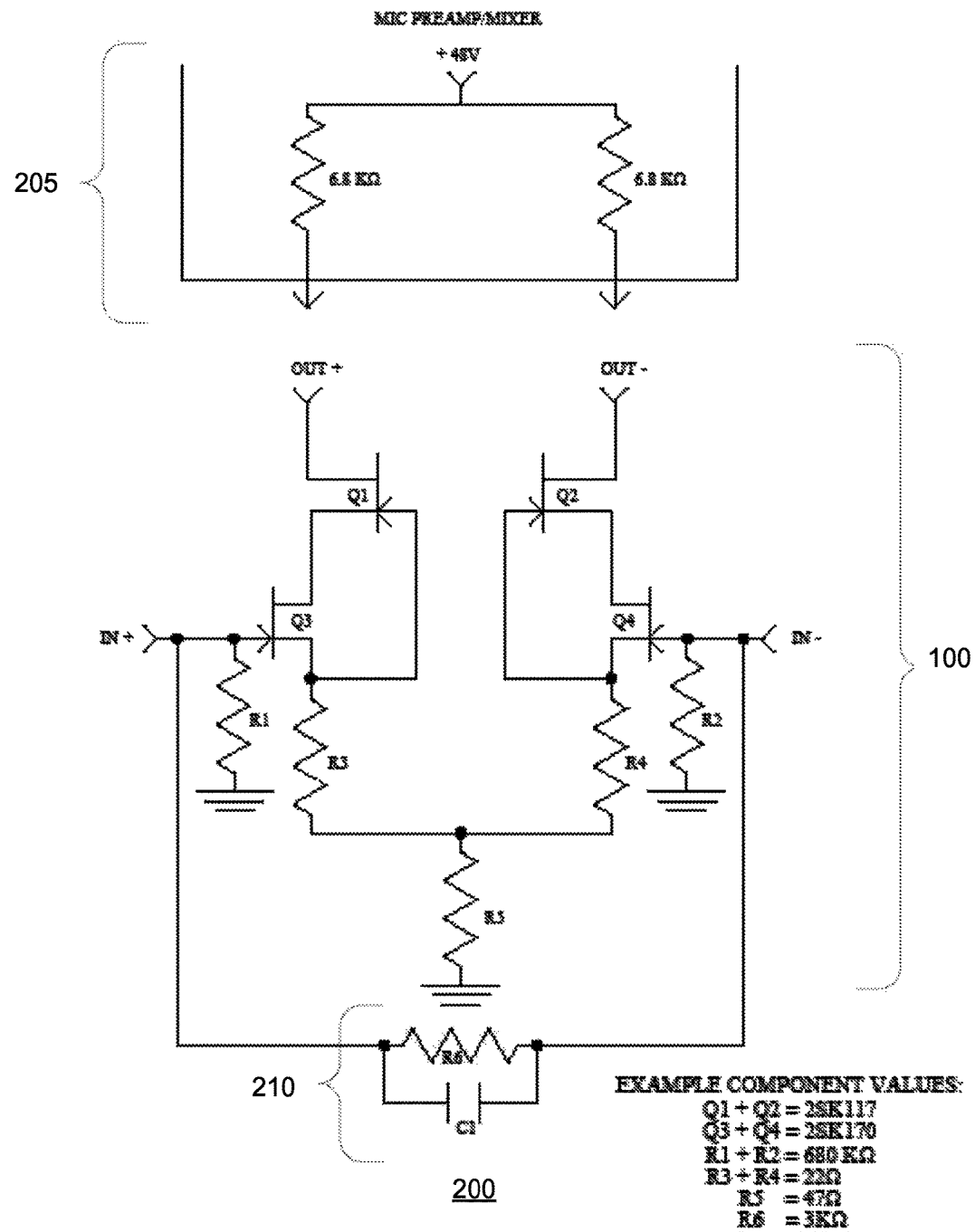
FIG. 2 shows a schematic of a phantom-powered circuit of FIG. 1 further comprising a resistor-capacitor network, in accordance with an embodiment of the invention.

Furthermore, in the preferred embodiment of the invention, one or more resistors (R3, R4, R5) are operatively connected to the first JFET (Q3) and the third JFET (Q4) within the phantom-powered JFET preamplifier gain circuit (100). In addition, as shown in FIG. 2, one or more gain-setting feed resistors (e.g. 6.8 kilo-ohm resistors in 205 of FIG. 2) supplying power to the phantom-powered JFET preamplifier gain circuit (100) are operatively connected to the positive signal output terminal or the negative signal output terminal of the phantom-powered JFET preamplifier gain circuit. In the preferred embodiment of the invention, the one or more gain-setting feed resistors are part of a preamplifier (205) operatively connected to the phantom-powered JFET preamplifier gain circuit (100).

This phantom-powered JFET circuit boosts a signal level of a passive microphone by approximately +20 dB with high-fidelity, when it is placed between a microphone output transformer and a phantom-powered microphone input device.

As shown in an application schematic (200) in FIG. 2, the JFET preamplifier gain circuit (100) uses phantom-power supply feed resistors (e.g. 6.8 kilo-ohm resistors in the preamplifier (205)) in a phantom power supply, wherein the feed resistors are external to the JFET preamplifier gain circuit (100), provide power, and serve as gain-setters to the JFET preamplifier gain circuit (100). As will be appreciated by one of ordinary skill in the art, the novel configuration of using the feed resistors as gain-setters in the phantom power supply outside of the JFET preamplifier gain circuit (100) enables simplification of the JFET preamplifier gain circuit (100) design, while minimizing potential signal distortions which could have been introduced in conventional JFET preamplifier gain circuits. The feed resistors also influence the final amount of signal boost or gain.

Furthermore, because the JFET preamplifier gain circuit (100) also utilizes one or more feed resistors remotely located in another device as gain-setting resistors, the JFET preamplifier gain circuit (100) does not have to use coupling transistors, resistors, or capacitors in its direct signal path. Furthermore, the JFET preamplifier gain circuit (100) does not have to use an output transformer. As will be appreciated by one of ordinary skill in the art, the JFET preamplifier gain circuit (100) is much simpler than typical phantom power circuits and has a reduced parts count, making the JFET preamplifier gain circuit (100) more cost effective to manufacture. Additionally, by providing a direct coupled signal path in the JFET preamplifier gain circuit (100), any potential distortion caused by coupling transformers or coupling capacitors can be eliminated from a preamp design in the present invention.

In a preferred embodiment of the invention, example component values may be "Q1+Q2=2SK117" and "Q3+Q4=2SK170" for JFET's, and "R1+R2=680 kilo-ohms", "R3+R4=22 ohms", and "R5=47 ohms" for resisters. In another embodiment of the invention, these component values may be different from the preferred embodiment of the invention.

Furthermore, as will be appreciated by one of ordinary skill in the art, the JFET preamplifier gain circuit (100) results in a significantly improved sound quality over conventional active microphone designs. By eliminating or reducing resistors in its direct signal path and no coupling transformers and coupling capacitors, the sound distortion common in all other phantom powered active circuits is largely removed. The production cost of the JFET preamplifier gain circuit (100) may be lower than conventional preamplifier gain circuits, while the sound quality is greatly improved by limiting the number of components in the signal path.

In one embodiment of the invention as shown in FIG. 2, the JFET preamplifier gain circuit (100) further includes a resistor-capacitor (RC) network (210) comprising a resistor (R6) and a capacitor (C1). In this embodiment of the JFET preamplifier gain circuit (100), the RC network (210) enables the JFET preamplifier gain circuit (100) to be used as an external box powered by a +48V power supply in a microphone input device without radio frequency interference associated with a cable length. In some embodiments of the invention, the JFET preamplifier gain circuit (100) is used in conjunction with a preamplifier (205), resulting in an approximately 20 dB of ultra-transparent high-fidelity gain.

In an embodiment of the invention as shown in FIG. 2, R6 provides a low impedance load from the positive input terminal to the negative input terminal, thereby reducing the potential for electromagnetic and radio frequency (RF) interferences. This is particularly significant when the cable length between the input terminals and the microphone transformer is longer than a few inches.

Moreover, C1 is an RF shunt capacitor in FIG. 2, wherein the RF shunt capacitor is able to suppress RF interferences when the wiring for a transformer-to-circuit input is long or poorly shielded by acting as an electrical dead short at radio frequencies. As will be appreciated by one of ordinary skill in the art, an electrical dead short is an electrical circuit that has zero resistance. As shown in FIG. 2, example component values in this embodiment of the invention may be "Q1+Q2=2SK117" and "Q3+Q4=2SK170" for JFET's, "R1+R2=680 kilo-ohms", "R3+R4=22 ohms", "R5=47 ohms", "R6=3 kilo-ohms" for resistors, and "C1=100 pF" for the RF shunt capacitor. In another embodiment of the invention, these component values may be different from the this embodiment of the invention.

Figure 3:
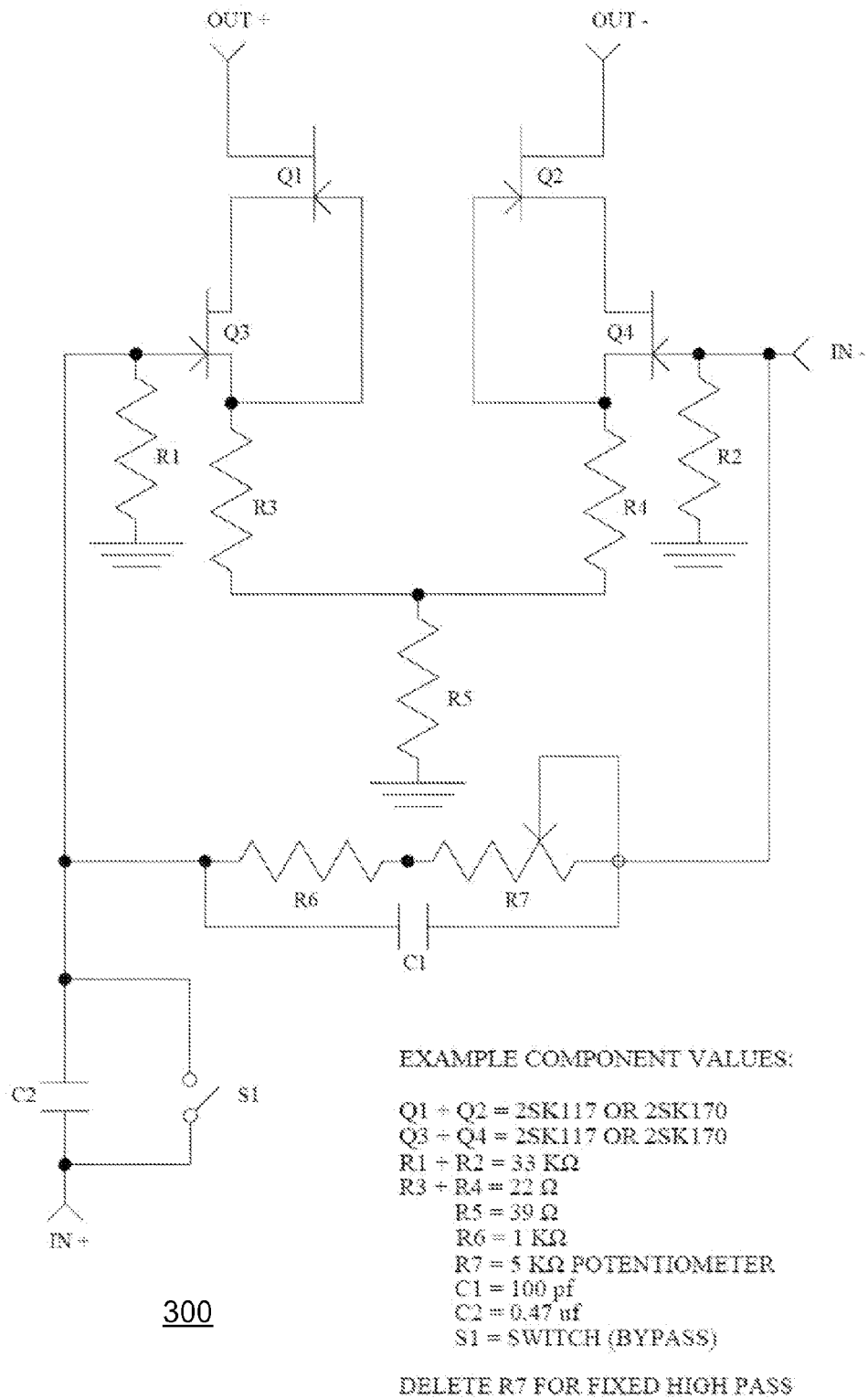
FIG. 3 shows a schematic of a JFET preamplifier gain circuit which includes a series capacitor, a bypass switch, and a potentiometer to an input circuitry, in accordance with an embodiment of the invention.

Furthermore, FIG. 3 shows another application schematic (300) of the JFET preamplifier gain circuit, which further includes a series capacitor (C2), a bypass switch (S1), and a potentiometer (R7) to the input circuitry. The capacitor (C2) acts as a high pass filter, which is bypassable via the switch (S1). The potentiometer (R7) varies the input load resistance, which both acts as a variable high pass control when the capacitor is not bypassed, and also as a variable load to the microphone that allows the user to vary the microphone sound according to the characteristics of the microphone's output transformer. An embodiment of the invention without the potentiometer may comprise a fixed high pass filter variation of the JFET preamplifier gain circuit (e.g. 100).

As shown in FIG. 3, example component values in this embodiment of the invention may be "Q1+Q2=2SK117 or 2SK170" and "Q3+Q4=2SK117 OR 2SK170" for JFET's, "R1+R2=33 kilo-ohms", "R3+R4=22 ohms", "R5=39 ohms", "R6=1 kilo-ohms" for resisters, "R7=5 kilo-ohms" for the potentiometer, and "C1=100 pF" and "C2=0.47 µF" for the capacitors. In another embodiment of the invention, these component values may be different from this embodiment of the invention.

Figure 4:
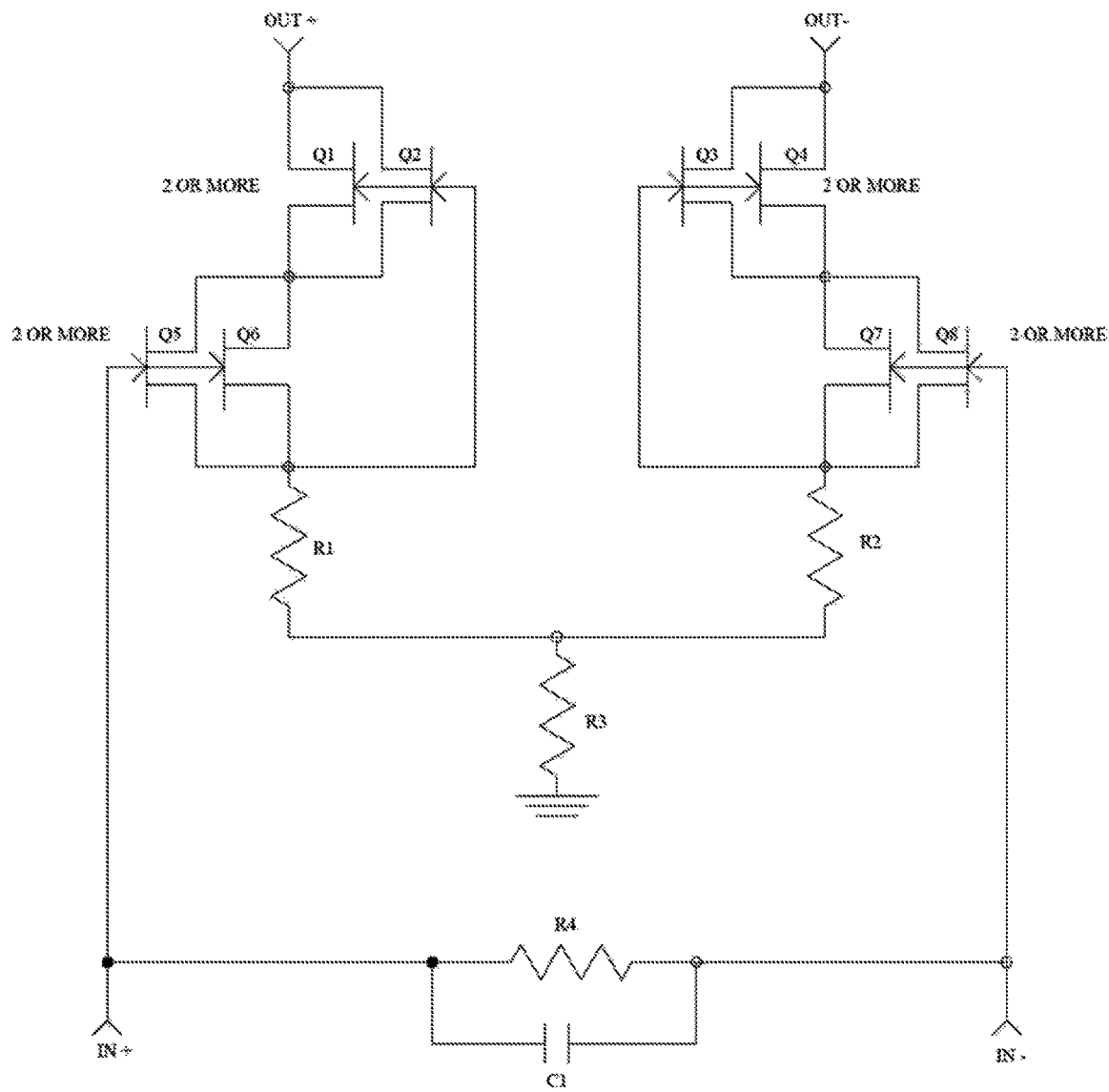
FIG. 4 shows a schematic of a JFET preamplifier gain circuit which includes two or more parallel-connected JFET devices in each FET device position, in accordance with an embodiment of the invention.

Moreover, FIG. 4 shows another application schematic (400) of the JFET preamplifier gain circuit with two or more parallel-connected JFET devices in each FET device position (e.g. Q5, Q6 in parallel, Q7, Q8 in parallel, and etc.). This allows for additional gain and/or lower noise, which can be achieved with two or more parallel-connected devices in either upper or lower pairs in the differential cascode, or as shown, with parallel devices in both upper and lower pairs in this variation of the JFET preamplifier gain circuit. Regardless of the number of FET devices used in each position, the fundamental design and function of the circuit remains the same. In fact, with alterations to accommodate the nature of devices chosen, this same circuit can be built with MOSFET devices, bipolar transistors, and even vacuum tubes with added power supply for filaments, and have the same fundamental design and function, characterized by a phantom-powered, differential, and folded cascode microphone pre-preamplifier circuit in at least one embodiment of the invention.

The novel JFET preamplifier gain circuit can be utilized in a standalone preamp box (e.g. commercially sold under a product name, "Cloudlifter") to amplify a sound source signal very cleanly. The standalone preamp box containing the novel JFET preamplifier gain circuit can greatly reduce typical noise present in conventional signal gain circuits. The resulting signal output from the standalone preamp box exhibits a substantially higher level of clarity and linearity for the purist "natural" reproduction of audio signals. In this embodiment of the invention, the JFET preamplifier gain circuit utilizes a conventional 48-volt phantom power, which may originate from a downstream mixer, a microphone preamp, an external power supply unit, a battery unit, or another source of power supply.

In other embodiments of the invention, the power supply may be substantially lower than 48 volts for powering the JFET preamplifier gain circuit. Electrical current requirements for the JFET preamplifier gain circuit are not particularly demanding, typically requiring only a few milliamps to provide a full gain. The low current requirement of the JFET preamplifier gain circuit design enables a convenient integration into various consumer electronic devices that utilize microphone inputs. For example, a power supply for a portable electronic device that utilizes a series of "AA," "AAA," 9-volt batteries, rechargeable mobile device batteries, or AC power sources can still provide sufficient voltage and current simultaneously to the JFET preamplifier gain circuit and to an actively-powered microphone in a phantom-power configuration. Therefore, in many instances, operating at a voltage lower than the conventional 48-V phantom power setup is primarily an exercise of adjusting various capacitor and/or resistor values.

For some embodiments of the invention, it is desirable to integrate the novel JFET preamplifier gain circuit into a consumer electronic device capable of recording from a microphone. The integration-friendly JFET preamplifier gain circuit comprises a unique cascode configuration of four or more JFETs, which provide very low-noise amplification for analog sound sources, such as microphones, instruments, phono signals, or other sound signal sources. An actual phantom power or a simulated phantom power may be provided to the JFET preamplifier gain circuit via an internal or external power supply, which also powers an active microphone.

The novel JFET preamplifier gain circuit may be incorporated into cellular phones, non-cellular telephones, tablet computers, laptops, desktop computers, handheld voice recorders, video cameras, two-way radio devices, conference microphone systems, wireless microphone receivers, wireless instrument receivers, public address systems, conventional preamplifiers or mixers, phonograph players, USB interface devices or digital audio workstation (DAW) for microphones or musical instruments, and any other electronic devices operating with a microphone. In one embodiment of the invention, the novel JFET preamplifier gain circuit can operate with an actively-powered microphone that is internally encased in an electronic device. In another embodiment of the invention, the novel JFET preamplifier gain circuit can operate with an external actively-powered microphone connected to an electronic device through an XLR microphone input interface. The novel JFET preamplifier gain circuit typically requires a phantom power source that simultaneously provides electrical "phantom power" to an actively-powered microphone and the novel JFET preamplifier gain circuit. Alternatively, the novel JFET preamplifier gain circuit may utilize an internal power source alone that simultaneously provides electrical power to the actively-powered microphone and the novel JFET preamplifier gain circuit.

One key advantage of utilizing the novel JFET preamplifier gain circuit is the achievement of an ultra low-noise signal amplification circuitry enabled by JFET's in a differential cascode configuration. The unique JFET differential cascode configuration, as exemplified in FIGS. 1-12, provides excellent common mode noise rejection. Another key advantage is amplifying the negative and the positive output signals independently, yet matching for gain. The independent amplification of the negative and the positive output signals provide noise cancellation from RF and electromagnetic interferences, thus resulting in a clearer and cleaner sound than a conventional pre-amplification or amplification method without the novel JFET preamplifier gain circuit.

For professional and home recording or broadcasting, integrating the novel JFET preamplifier gain circuit in a preamplifier unit or another electronic device is desirable because of the improved clarity, noise reduction, and linearity of the sound source after the pre-amplification from the novel JFET preamplifier gain circuit, before subjecting the sound source to any additional and conventional amplification processing. Furthermore, in some embodiments of the invention, by integrating the novel JFET preamplifier gain circuit to various consumer electronic devices, such as smart phones, handheld recorders, and video/audio recorders, the user can also experience superior sound quality (i.e. lower noise floor, more natural frequency response, etc.) during an audio playback after recording voice memos, music, or other activities that involve recording of sound.

Furthermore, the novel JFET preamplifier gain circuit may also provide advantages in first responder and/or military communication applications. The increased clarity, audio quality, and signal-to-noise ratio (SNR) can be mission-critical in time-sensitive and critical communication applications, because any miscommunications due to distortion, interference, and other noise-related distractions can lead to mission failures or unintended consequences.

In video/audio monitoring and surveillance systems, the improved clarity, audio quality, and signal-to-noise ratio (SNR) enabled by incorporation of the novel JFET preamplifier gain circuit also provide great advantages. In these system applications, the noise floor and sensitivity of the microphone and amplification system often become a limiting factor in picking up lower-level sound sources. For example, recordable audio data from someone speaking in a very low voice may be inaudible or unrecognizable, when that level is below the level of the system's self-generated operating noise or ambient white noise. By incorporating the novel JFET preamplifier gain circuit (i.e. as shown in various embodiments of the present invention) into an audio pre-amplification section of a video/audio monitoring and surveillance system, the noise floor would be drastically reduced. The reduced noise floor can provide substantially higher clarity for recording and processing subtle sounds and lower-level voices, which result in a higher-quality and higher-sensitivity audio recording and playback for the video/audio monitoring and surveillance system.

In some embodiments of the invention, the novel JFET preamplifier gain circuit is also integrated into a preamp or preamp section of a mixing console, which is typically utilized for live or studio applications in musical events, recordings, or broadcasts. The novel JFET preamplifier gain circuit may be enabled or disabled with an on/off switch in the preamp or the preamp section of the mixing console, which is particularly useful for allowing phantom-powering of a microphone, direct-coupling of the microphone to the novel JFET preamplifier gain circuit, or bypassing of the novel JFET preamplifier gain circuit with powered microphones.

Moreover, for other audio-recordable devices such as conference microphones, public address (PA) systems, mobile communication devices, handheld recorders, two-way radios, and any other devices that reproduce sound from a transducer (i.e. a microphone, an instrument pickup), the novel JFET preamplifier gain circuit can provide advantages of enabling a significantly-lower noise floor over conventional gain stages, while also achieving an increased sensitivity and clarity with more natural or linear frequency responses.

Another advantage of incorporating the novel JFET preamplifier gain circuit in a microphone-connected electronic device is that a dynamic moving coil or other types of passive microphones can be utilized as an alternative to a powered microphone. Many passive microphones, which are not electrically powered, in contrast to actively-powered microphones, have a much more natural frequency response over condensers or electret condensers that require active electrical power. Many actively-powered microphones tend to produce exaggerated frequency responses, particularly in the higher frequency range, and are prone to inadvertently introducing audible distortions and unpleasant tones.

In various embodiments of the present invention, an active microphone power supply circuitry can be conveniently bypassed or eliminated to directly couple the novel JFET preamplifier gain circuit to the microphone's output. This direct coupling can create a gain stage without additional components in the audio signal processing path. The realization of this gain stage can be a significant advantage in embodiments that utilize an external microphone for primarily capturing voice-related sound from a dynamic moving coil microphone or another microphone preferred by broadcasters, voiceover actors, pod-casters, and event speakers.

It should be noted that conventional microphone-connected electronic devices, such as handheld recorders, cellular phones, and video cameras do not provide sufficient gain for low-output microphones, such as dynamic moving coil microphones. Therefore, using these types of low-output microphones is often challenging due to the high noise floor created by the inefficient or insufficient conventional gain stages from conventional preamplifiers. Furthermore, low-output microphones can also suffer undesirable RF or EM interferences. By integrating the novel JFET preamplifier gain circuit as a first-stage (i.e. earliest stage) gain for the microphone's signal output, unwanted noise and interferences can be greatly reduced, while the microphone sensitivity can be greatly improved. Furthermore, RF and EM interferences can be eliminated through phase cancellation within the differential cascode configuration of the novel JFET preamplifier gain circuit. The improved sound clarity, microphone sensitivity, and unwanted noise and interferences reduction via a novel integration of the JFET preamplifier gain circuit provide many advantages in various audio recording applications, as described above.

Figure 5:
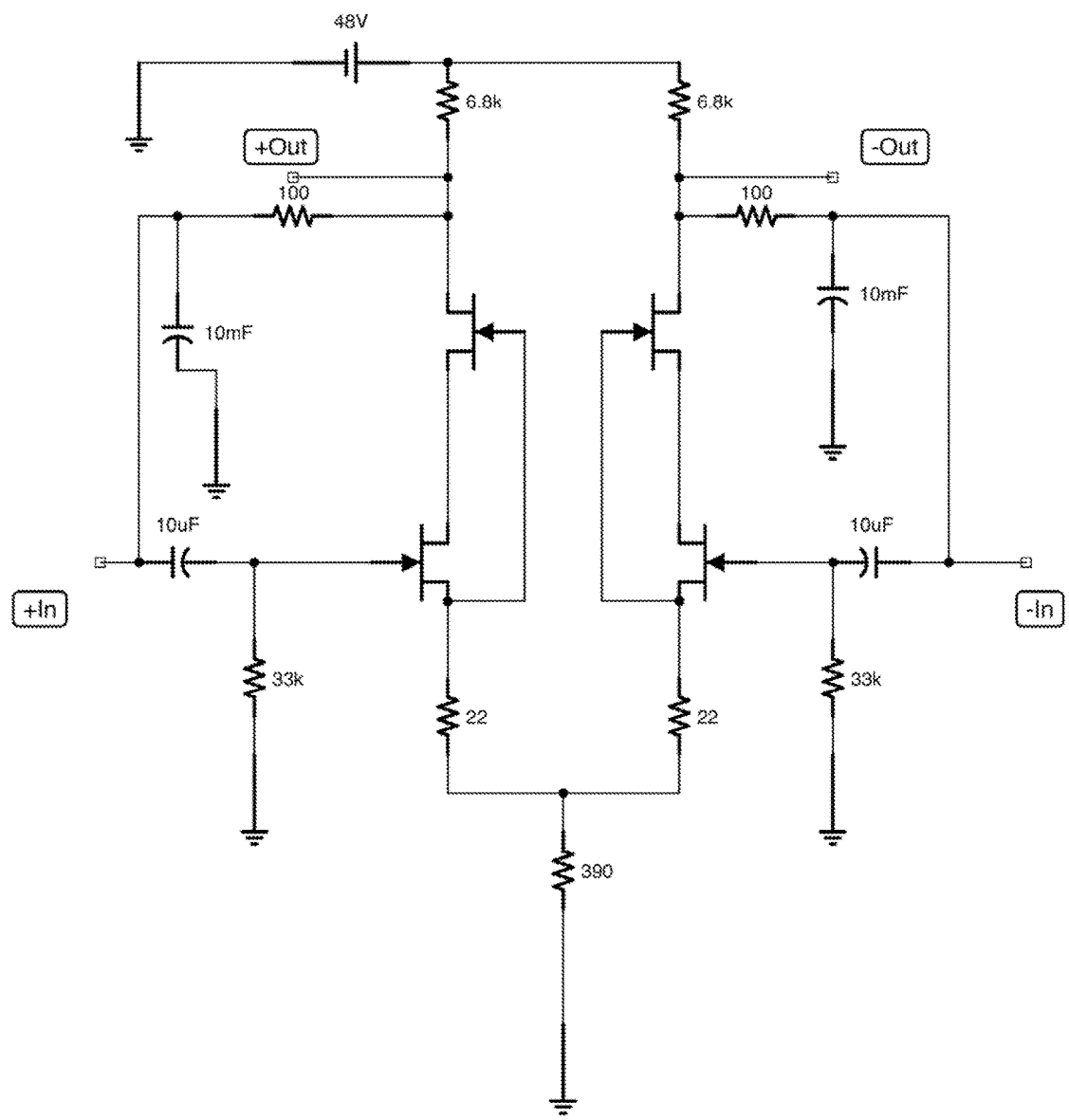
FIG. 5 shows a schematic example of a JFET preamplifier gain circuit that can power its internal circuitry and an active microphone simultaneously with a single power source, in accordance with an embodiment of the invention.

Continuing with describing various embodiments of the invention as illustrated in the figures, FIG. 5 shows an schematic example (500) of a JFET preamplifier gain circuit that can power its internal circuitry and an active microphone simultaneously with a phantom-power source, in accordance with an embodiment of the invention. The schematic example (500) shows how the JFET preamplifier gain circuit has a cascode differential configuration, with four JFET's and RC networks. The JFET preamplifier gain circuit is phantom-powered by a power source (e.g. a 48V power supply) that simultaneously supplies electricity to an actively-powered microphone.

The schematic example (500) can be implemented in a standalone preamplifier unit, or integrated into another electronic device. The power source could be phantom power from an external mixer in the standalone configuration, or from an internal power source such as a battery or power supply. Although the schematic example (500) shows the phantom power voltage of 48, the cascode differential configuration of the JFET preamplifier gain circuit works with lower voltage power sources, such as 9V batteries or a series of "AA" or "AAA" batteries. The JFET preamplifier gain circuit will also operate well with an internal 5V or 12V power supply, or with a low voltage rechargeable battery typically found in a mobile device (e.g. a tablet computer or a cellular phone). Lowering perating voltages lower than the standard 48V phantom power involves a straightforward task of adjusting resistor and capacitor values in one or more RC networks to provide sufficient electrical current to the JFET preamplifier gain circuit and a microphone. As described previously, because the JFET preamplifier gain circuit requires very little current (i.e. typically a few milliamps) and because typical actively-powered microphones also merely require small amount of current, the lowered power operating voltage does not present significant design implementation challenges to circuit designers.

Figure 6:
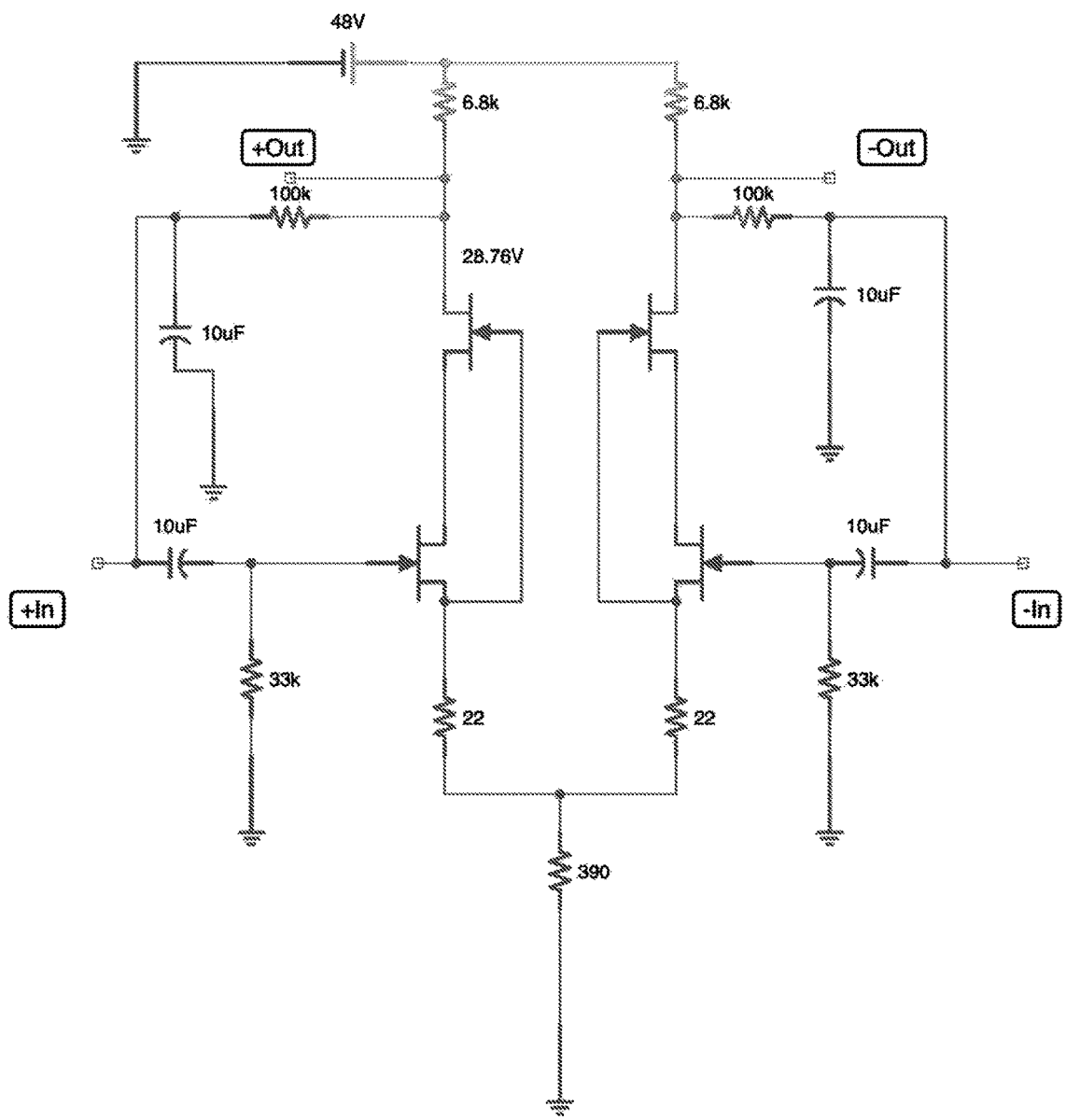
FIG. 6 shows another schematic example of a JFET preamplifier gain circuit that can power its internal circuitry and an active microphone simultaneously with a single power source, in accordance with an embodiment of the invention.

FIG. 6 shows another schematic example (600) of a JFET preamplifier gain circuit that can power its internal circuitry and an active microphone simultaneously with a phantom-power source, in accordance with an embodiment of the invention. This schematic example (600) is very similar to the previously-described schematic example (500) of FIG. 5, but has some different shunt capacitor values (e.g. 10 micro-Farad capacitors, instead of 10 milli-Farad capacitors) and resistor values (e.g. 100 kilo-ohms resistors, instead of 100-ohms resistors).

Figure 7:
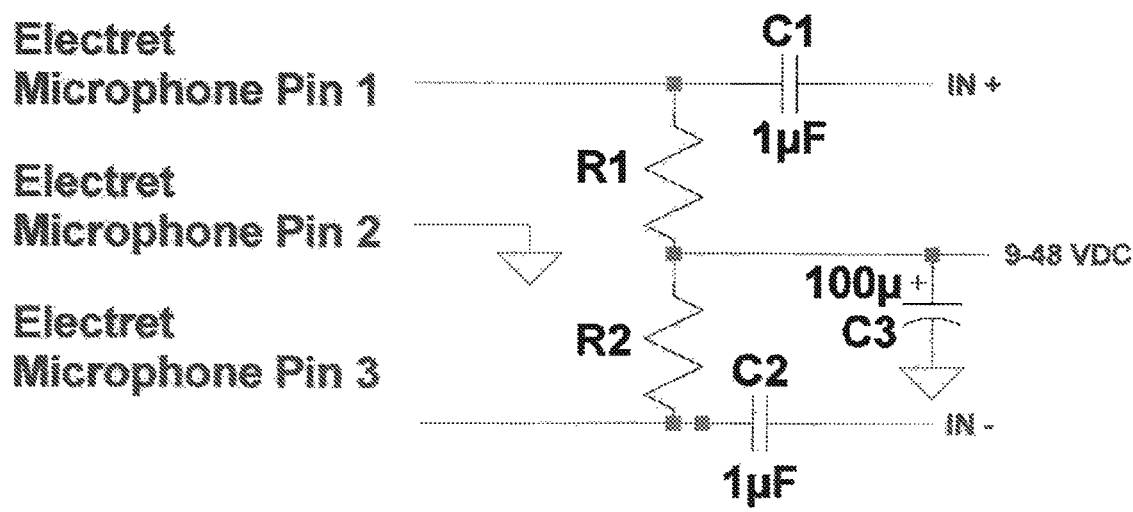
FIG. 7 shows an example of a resistor and capacitor network for a typical electret condenser microphone incorporated in a cell phone, a portable computer device, a video recorder, and/or other consumer electronic devices with microphones.

FIG. 7 shows an example (700) of a resistor and capacitor network for a typical electret condenser microphone incorporated in a cell phone, a portable computer device, a video recorder, and/or other consumer electronic devices with microphones. In this example (700), the electret condenser microphone has three pins (i.e. Pin 1, 2, 3) for the microphone connection. The interface circuit comprising the resistor and capacitor network (e.g. C1, C2, C3, R1, R2) for the electret condenser microphone can be coupled to the JFET preamplifier gain circuit, and share the supplied power (e.g. 9-48 VDC) as the phantom power supplied to the JFET preamplifier gain circuit as well as to the microphone.

Figure 8:
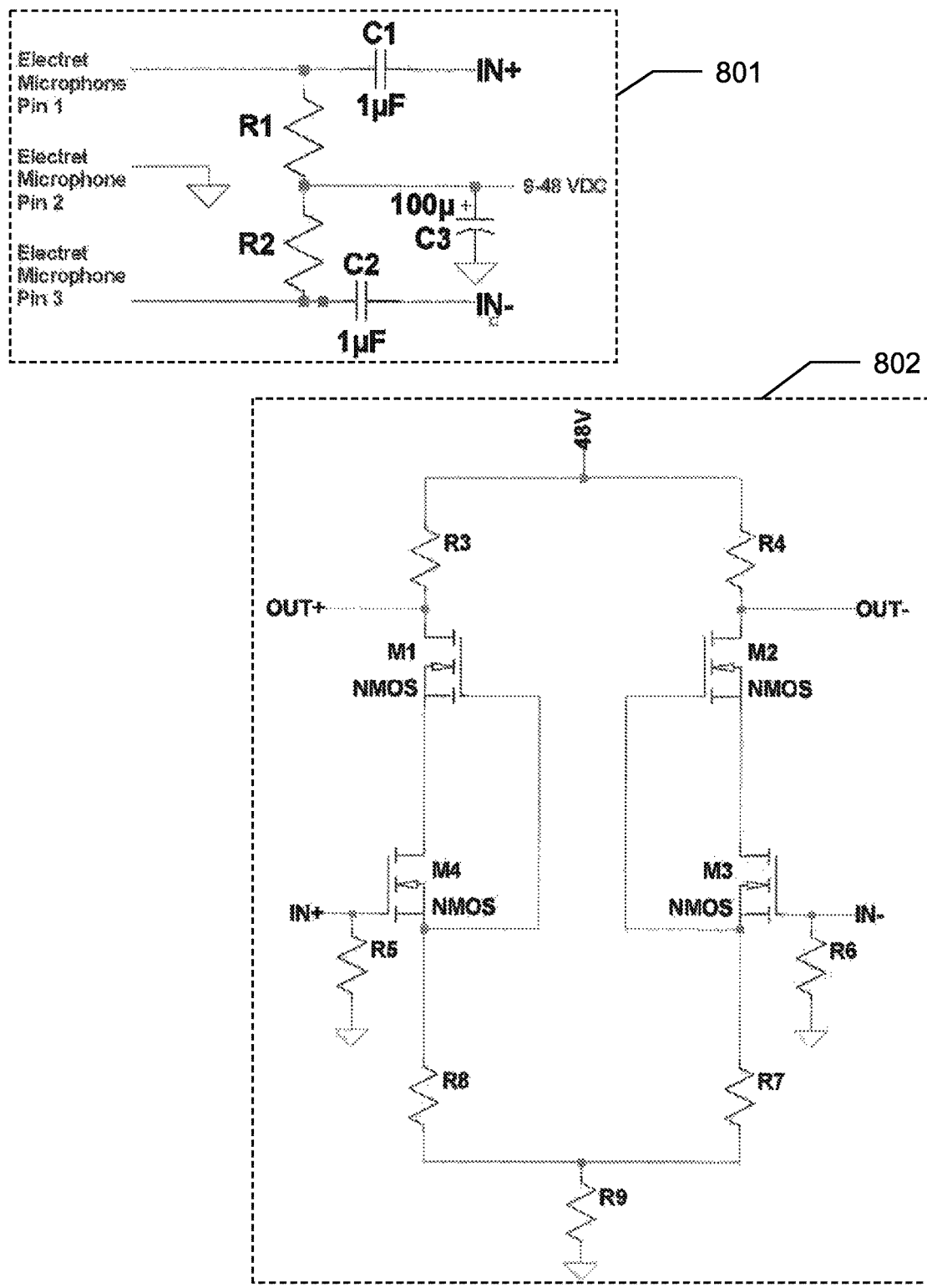
FIG. 8 shows an example of powering an electret condenser microphone and a JFET preamplifier gain circuit with a same power source and a capacitor resistor network that enable the same or different operating voltages to each other, in accordance with an embodiment of the invention.

FIG. 8 shows an example of powering an electret condenser microphone through an interface circuit (801) and a JFET preamplifier gain circuit (802) with a same power source and a capacitor resistor network that enable the same or different operating voltages to each other, in accordance with an embodiment of the invention. The interface circuit (801) for the electret condenser microphone and the JFET preamplifier gain circuit (802) can be directly coupled to each other through input terminals (IN+, IN−), and share the same power source (e.g. 9-48 VDC) as their power supply. This example shows 9-48V for the microphone interface circuit (801) and 48V for the JFET preamplifier gain circuit (802). However, in other embodiments of the invention, the phantom power can operate at a significantly lower voltage, and can even be configured to operate at 1.5 V or less.

Figure 9:
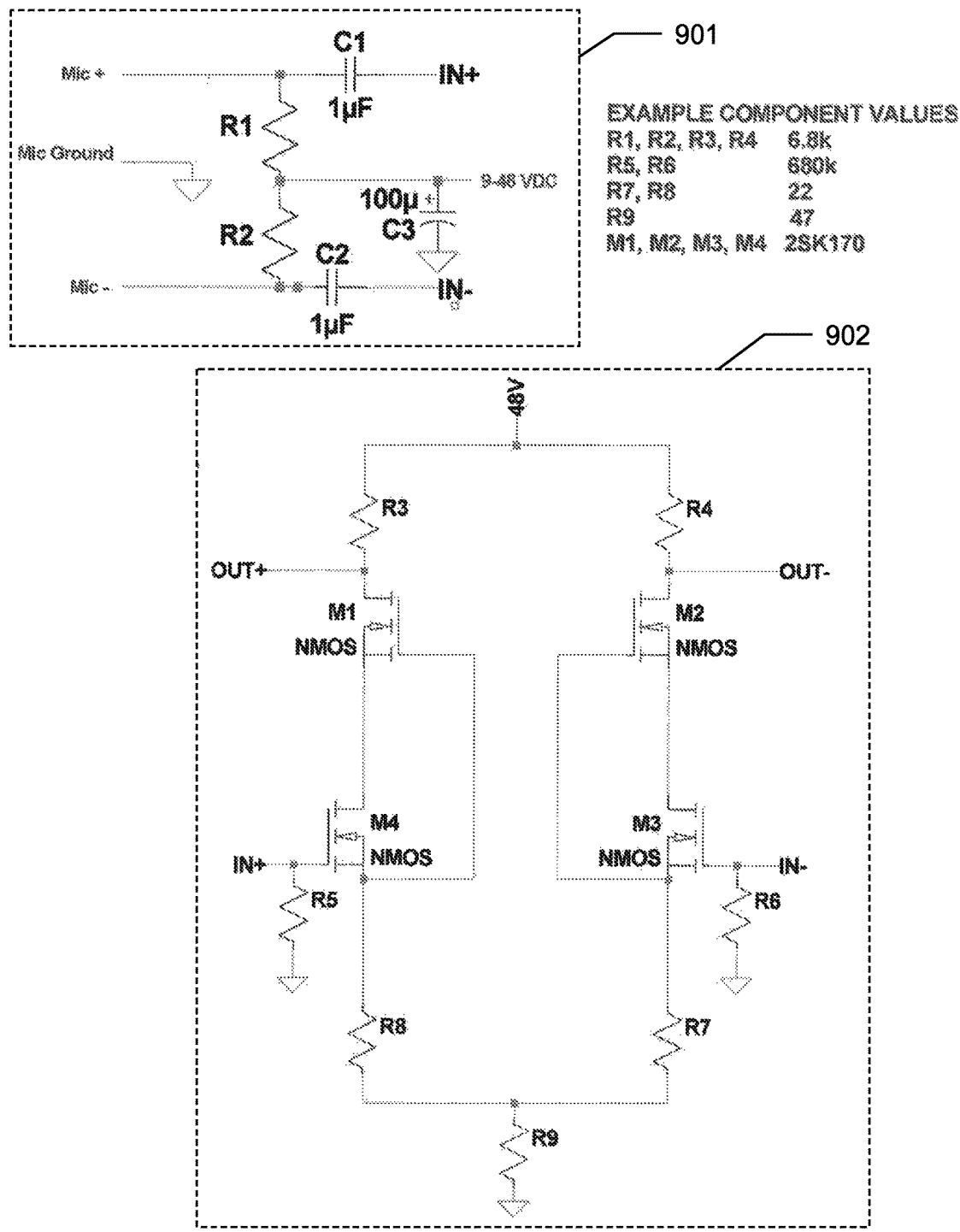
FIG. 9 shows another example of powering an electret condenser microphone and a JFET preamplifier gain circuit with a same power source and a capacitor resistor network when the JFET preamplifier gain circuit is integrated into a cell phone, a laptop computer, or a video camera, in accordance with an embodiment of the invention.

FIG. 9 shows another example of powering an electret condenser microphone through an interface circuit (901) and a JFET preamplifier gain circuit (902) with a same power source and a capacitor resistor network. This example shows exemplary component values or types for resistors (e.g. 6.8 k-ohms for R1~R4, 680 k-ohms for R5~R6, 22 ohms for R7~R8, and 47 ohms for R9), for capacitors (e.g. 1 micro-Farads for C1 and C2, and 100 micro-Farads for C3), and for n-type JFET's (Model Number "2SK170" for M1, M2, M3, M4), as shown in FIG. 9.

The exemplary component values in FIG. 9 may be particularly useful in some embodiments of the invention that integrate the JFET preamplifier gain circuit (902) into a portable consumer electronic device, such as a cellular phone, a laptop computer, or a video camera. However, other appropriate values for each component and for the power voltage may be utilized, depending on a design requirement of a particular implementation for integrating the JFET preamplifier gain circuit (902) into a microphone-connected consumer electronic device.

Figure 10:
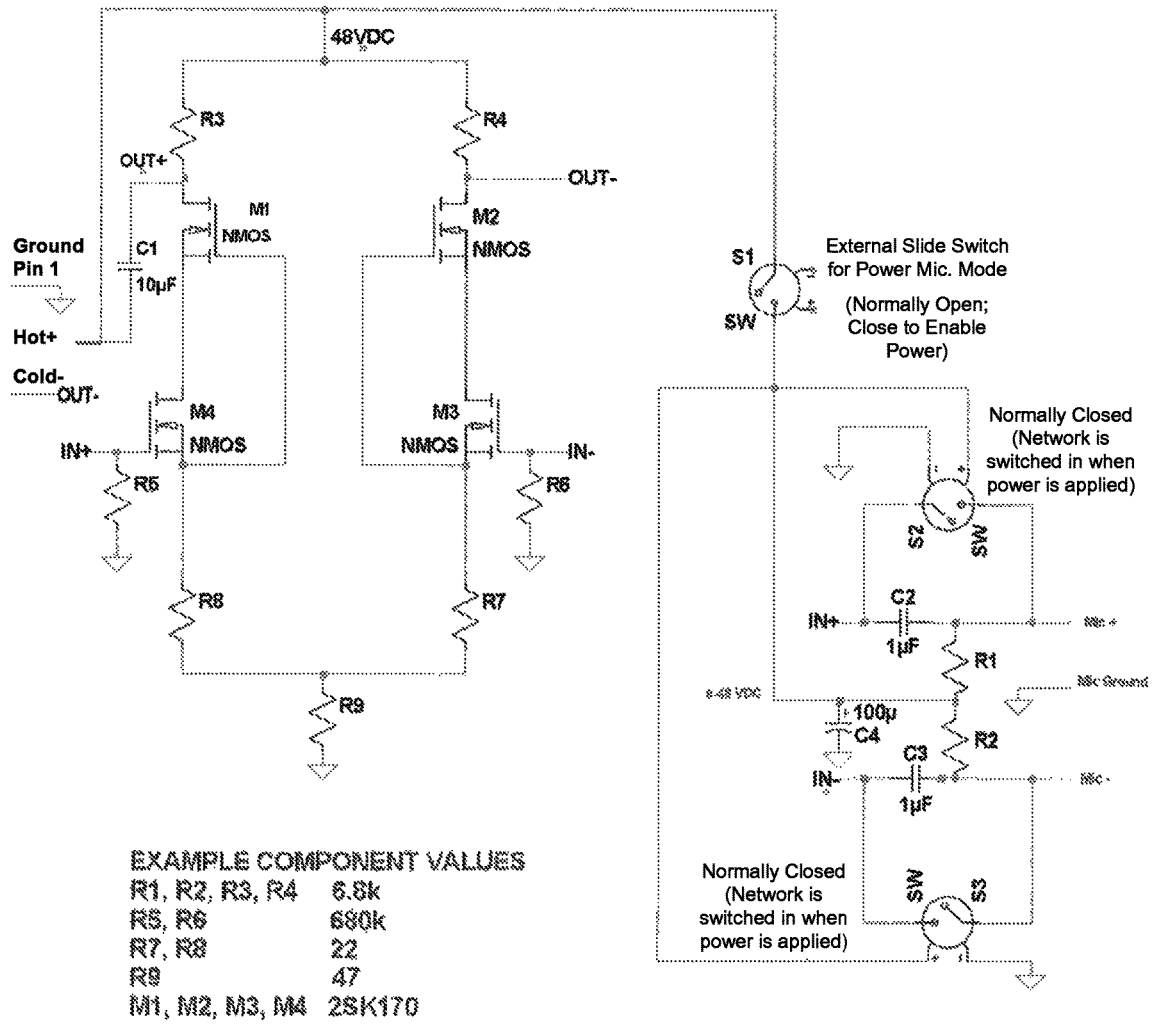
FIG. 10 shows an example of integrating a JFET preamplifier gain circuit in an electronic device that has an XLR connection interface for an external microphone with a switchable microphone power, in accordance with an embodiment of the invention.

FIG. 10 shows a schematic example (1000) for integrating JFET preamplifier gain circuit in an electronic device that has an XLR connection interface for an external microphone with a switchable microphone power, in accordance with an embodiment of the invention. This example shows how the JFET preamplifier gain circuit could be configured within a device that has an input (i.e. the XLR connection interface) for an external microphone. Video cameras, handheld recorders, mixers, preamps, digital audio workstation interfaces, USB interfaces with microphone inputs, and other professional and consumer devices with microphone input jacks, can be configured to integrate the JFET preamplifier gain circuit for the earliest stage amplification.

In the schematic example (1000) as shown in FIG. 10, the microphone input has a first switch (S1) to control power to the microphone. When this first switch (S1) is closed, it has a net effect of opening a second switch (S2) and a third switch (S3), which allows the electrical power supply to reach the microphone through the microphone connection terminals (i.e. Mic+, Mic−).

On the other hand, when the first switch (S1) is open, the second switch (S2) and the third switch (S3) are closed, and the power source to the microphone is completely bypassed. This bypass mode can be particularly advantageous with a very low-output microphone, such as a dynamic moving coil microphone. The first switch (S1), as shown in the schematic example (1000), may be an external slide switch or another appropriate selection-enabling interface.

Due to the low native sensitivity in a low-output microphone, the power bypass mode allows the low-output microphone to be direct-coupled to the input terminals of the JFET preamplifier gain circuit. This direct coupling can reduce unnecessary components that are prone to causing noises or interferences in the audio signal processing pathway.

Figure 11:
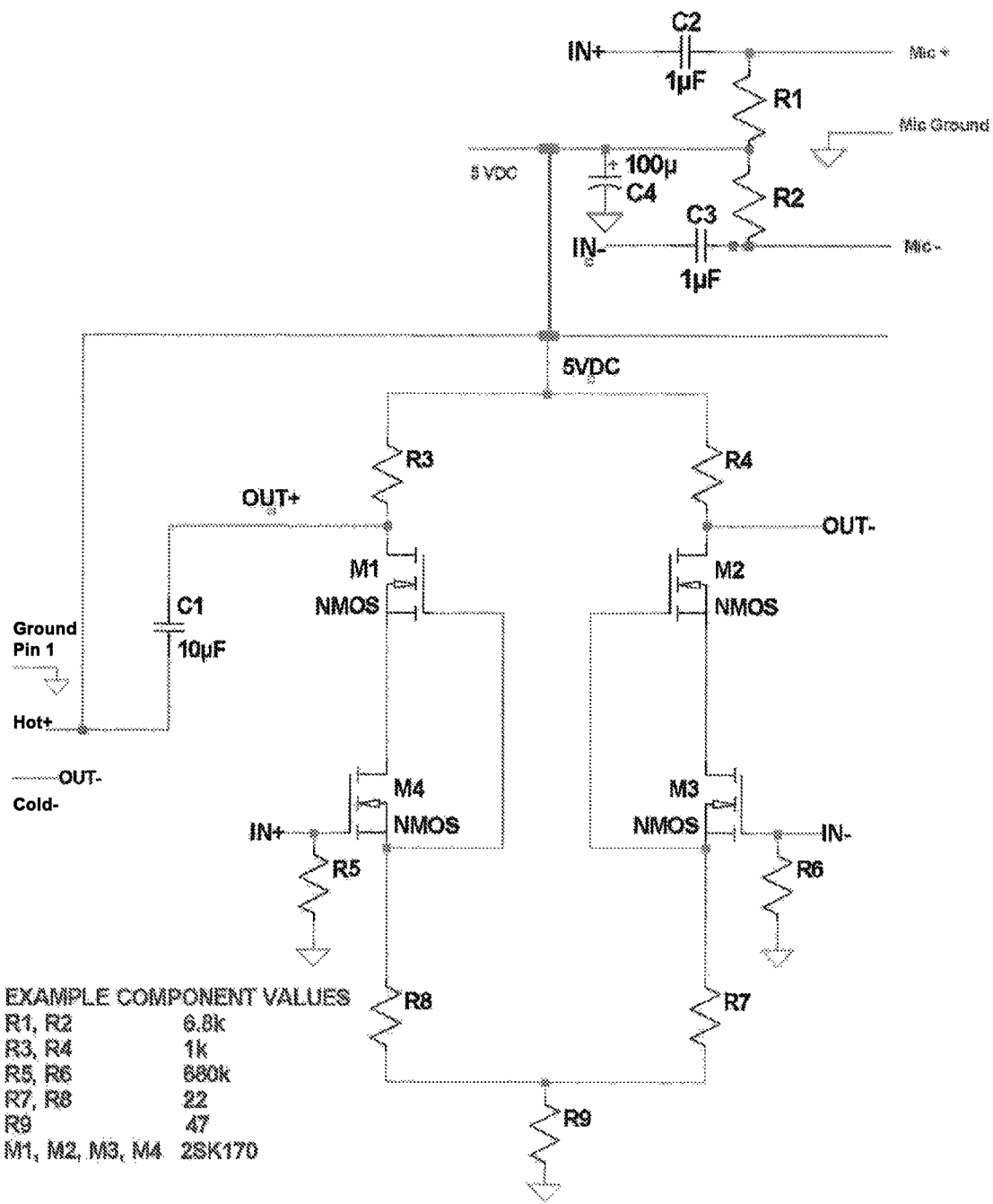
FIG. 11 shows an example of powering a JFET preamplifier gain circuit after integration into a USB device that typically operates on a five-volt supply, in accordance with an embodiment of the invention.

FIG. 11 shows an example (1100) of powering a JFET preamplifier gain circuit after integration into a USB device that typically operates on a 5-volt (5 VDC) supply, in accordance with an embodiment of the invention. As shown in the example (1100), the JFET preamplifier gain circuit is powered by the 5-volt supply, which also simultaneously powers an actively-powered microphone connected to or incorporated in the USB device.

Figure 12:
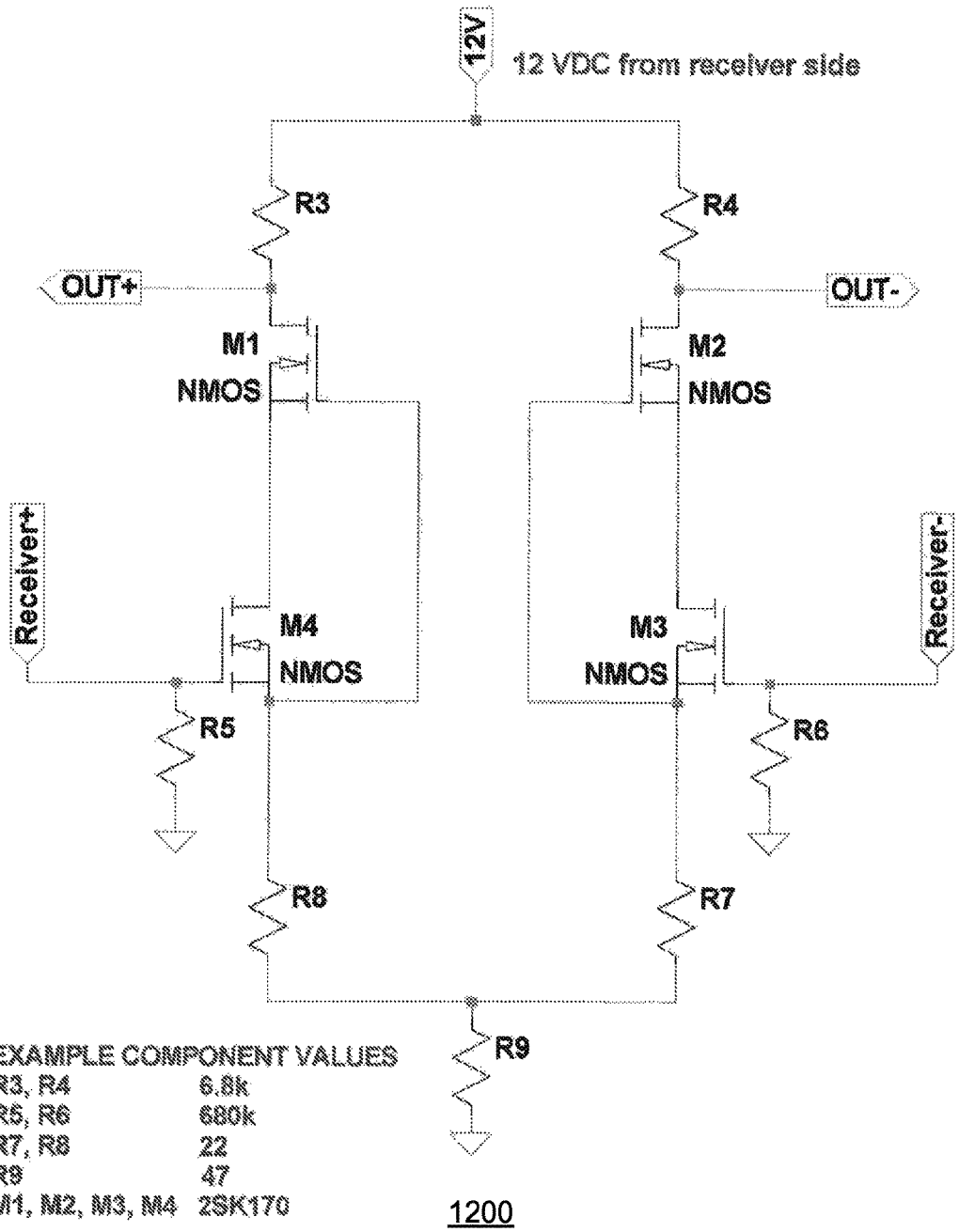
FIG. 12 shows a JFET preamplifier gain circuit integrated into a wireless microphone receiver unit for amplification prior to further processing in a mixing console or a conventional microphone preamplifier, in accordance with an embodiment of the invention.

FIG. 12 shows a schematic example (1200) of a JFET preamplifier gain circuit integrated into a wireless microphone receiver unit for amplification prior to further processing in a mixing console or a conventional microphone preamplifier, in accordance with an embodiment of the invention. As shown in the schematic example (1200), a 12 VDC power supply from the wireless microphone receiver unit feeds into the JFET preamplifier gain circuit. Alternatively, the JFET preamplifier gain circuit can be powered from the mixing console's phantom power. However, in most situations, it may be preferable to utilize the onboard power supply (e.g. 12 VDC), which already exists in the wireless microphone receiver unit.

In a preferred embodiment of the invention, the JFET preamplifier gain circuit processes an analog output stage of the wireless microphone receiver unit before producing an amplified output that feeds into the mixing console or the conventional microphone preamplifier. The early stage gain produced by the JFET preamplifier gain circuit enhances the audio quality and the amount of gain at an earlier stage than conventional methods of signal amplifications, which enables the subsequent and conventional amplification of signals to operate at a lower gain level. Allowing the subsequent and conventional amplification of signals to operate at a lower gain level reduces noise, distortion, and interference, which may have been undesirably present if the required gain level were higher from the conventional amplification unit alone.

Furthermore, in many audio recording, amplification, and reproduction applications, mixers and preamps are in an optimal performance range with a high signal-to-noise ratio within the first ⅓ to ½ of their maximum gain levels. If the gain level is higher than ½ of the maximum possible gain in a conventional mixer or a conventional preamp, then the transformed and amplified sound tend to add a substantial amount of noise and distortions, thus causing a noticeable deterioration in audio quality. Therefore, by utilizing the JFET preamplifier gain circuit at an early stage (i.e. typically before a conventional preamp unit or a conventional mixer unit) of processing microphone signals, the conventional preamp and mixer equipment does not have to crank up their gain levels as much as they otherwise would be required to do to reach a desirable level of sound amplification.

Figure 13:
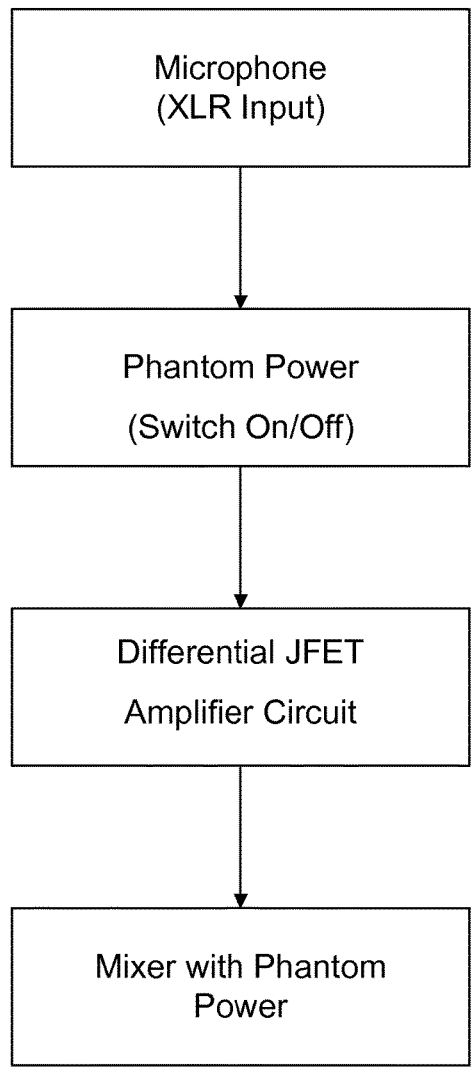
FIG. 13 shows a phantom-powered JFET gain circuit pass-through application flowchart, in accordance with an embodiment of the invention.

FIG. 13 shows a phantom-powered JFET gain circuit pass-through application flowchart (1300), in accordance with an embodiment of the invention. The phantom-powered JFET gain circuit pass-through application flowchart (1300) shows a signal processing path of a standalone phantom-powered JFET gain circuit box, wherein the phantom power to a microphone and the phantom-powered JFET gain circuit box is provided by a downstream preamp or a mixer unit.

As shown in FIG. 13, a microphone signal is first received through an XLR input interface. The phantom power needs to be switched on to power the standalone phantom-powered JFET gain circuit box. Then, the phantom-powered JFET gain circuit in a differential cascode configuration amplifies the microphone signal. The amplified microphone signal from the phantom-powered JFET gain circuit is then transmitted to a mixer unit that may also provide phantom power to the microphone, the standalone phantom-powered JFET gain circuit box, and/or other devices.

Figure 14:
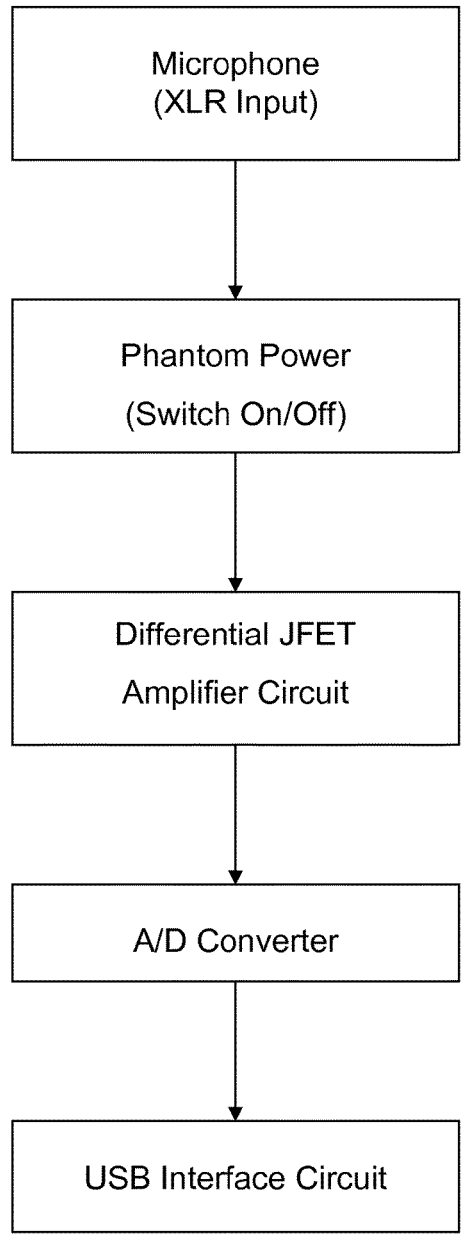
FIG. 14 shows an application flowchart for a phantom-powered JFET gain circuit integrated in a USB microphone interface, in accordance with an embodiment of the invention.

FIG. 14 shows an application flowchart (1400) for a phantom-powered JFET gain circuit integrated in a USB microphone interface, in accordance with an embodiment of the invention. This application flowchart (1400) shows a signal processing path of the phantom-powered JFET gain circuit integrated in the USB microphone interface, wherein the phantom power to a microphone and the phantom-powered JFET gain circuit is provided by the USB microphone interface, typically operating at 5 VDC.

As shown in FIG. 14, a microphone signal is first received through an XLR input interface. The phantom power needs to be switched on to power a phantom-powered active microphone, and switched off when connecting to a passive microphone. The JFET gain circuit is internally powered when it is integrated in the USB microphone interface. Then, the phantom-powered JFET gain circuit in a differential cascode configuration amplifies the microphone signal. The amplified microphone signal from the JFET gain circuit is then transmitted to an A/D converter and/or an added gain stage, which eventually outputs digitized audio data to a USB interface circuit in the USB microphone interface, as shown in FIG. 14. In another embodiment of the invention, other types of digital ports such as FireWire and Digital Audio Workstation (DAW) can be connected to the output of the A/D converter and/or the added gain stage to store or further process the digitized audio data.

Figure 15:
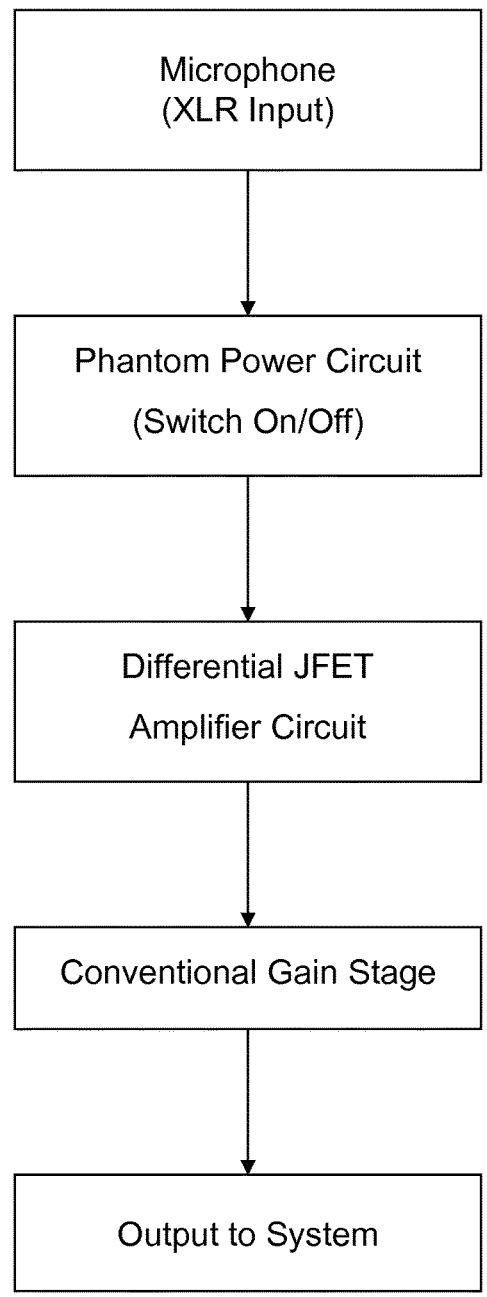
FIG. 15 shows an application flowchart for a phantom-powered JFET gain circuit integrated in a video camera or another portable recording device, in accordance with an embodiment of the invention.

FIG. 15 shows an application flowchart (1500) for a JFET gain circuit integrated in a video camera or another portable recording device, in accordance with an embodiment of the invention. This application flow chart (1500) shows the JFET gain circuit integrated as the first stage (i.e. earliest stage) processing for a microphone's output associated with a video camera or another portable recording device.

Furthermore, the application flowchart (1500) for FIG. 15 shows a signal processing path of the phantom-powered JFET gain circuit integrated in the video camera or another portable recording device, wherein the phantom power to a microphone and the JFET gain circuit is provided by a power supply of the video camera or another portable recording device. As shown in FIG. 15, a microphone signal is first received through an XLR input interface. The phantom power needs to be switched on to power the microphone externally connected through the XLR input interface. Then, the phantom-powered JFET gain circuit in a differential cascode configuration amplifies the microphone signal. The amplified microphone signal from the phantom-powered JFET gain circuit is then transmitted to a conventional signal gain stage within the portable recording device, which further amplifies the audio signal and outputs the amplified audio signal to a speaker or another audio processing unit.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An electronic device incorporating a phantom-powered JFET gain circuit coupled to a microphone, the electronic device comprising:
   a microphone connected to the electronic device internally or externally;
   a power supply unit connected to the electronic device internally or externally, wherein the power supply unit provides a phantom power to the microphone and to the phantom-powered JFET gain circuit in the electronic device;
   a first JFET with its gate terminal operatively connected to a positive signal input terminal, wherein the first JFET is operatively connected to a second JFET in cascode having a positive signal output terminal for the phantom-powered JFET gain circuit;
   a third JFET with its gate terminal operatively connected to a negative signal input terminal, wherein the third JFET is operatively connected to a fourth JFET in cascode having a negative signal output terminal for the phantom-powered JFET gain circuit;
   one or more resistors operatively connected to the first JFET and the third JFET within the phantom-powered JFET gain circuit; and
   one or more gain-setting feed resistors external to the phantom-powered JFET gain circuit, wherein the one or more gain-setting feed resistors are operatively connected to the positive signal output terminal or the negative signal output terminal of the phantom-powered JFET gain circuit.

2. The electronic device of claim 1, wherein the first JFET, the second JFET, the third JFET, the fourth JFET, the one or more resistors, and the one or more gain-setting feed resistors comprise the phantom-powered JFET gain circuit to generate an earliest-stage amplified signal from the microphone.

3. The electronic device of claim 2, further comprising a conventional preamplifier unit connected to the positive signal output terminal and the negative signal output terminal of the phantom-powered JFET gain circuit to further amplify the earliest-stage amplified signal generated from the phantom-powered JFET gain circuit.

4. The electronic device of claim 2, further comprising a microphone interface circuitry connected to the microphone, wherein the positive signal input terminal and the negative signal input terminal of the phantom-powered JFET gain circuit are connected to the microphone interface circuitry.

5. The electronic device of claim 1, further comprising an XLR microphone input interface unit.

6. The electronic device of claim 1, wherein the electronic device is a cellular phone, a non-cellular telephone, a tablet computer, a laptop computer, a desktop computer, a handheld voice recorder, a video camera, a two-way radio device, a conference microphone system, a wireless microphone receiver, a wireless instrument receiver, a public address system, a conventional preamplifier unit, a sound mixer unit, a phonograph player unit, or a USB interface device, or a digital audio workstation device for microphones, musical instrument pickups, or other transducers.

7. The electronic device of claim 1, further comprising an RC network within the phantom-powered JFET gain circuit, wherein the RC network includes an additional resistor and an RF shunt capacitor, and wherein the RC network enables the electronic device to be powered by a power supply to the microphone without radio frequency interference associated with cable length.

8. The electronic device of claim 1, further comprising a series capacitor, a bypass switch, and a potentiometer to the positive signal input terminal and the negative signal input terminal as a bypassable high-pass filter with a variable input load in the phantom-powered JFET gain circuit.

9. The electronic device of claim 1, wherein an additional JFET may be operatively connected in parallel to any one of the first JFET, the second JFET, the third JFET, and the fourth JFET in the phantom-powered JFET gain circuit.

10. The electronic device of claim 1, wherein the one or more gain-setting feed resistors external to the phantom-powered JFET gain circuit also provide electrical power to the phantom-powered JFET gain circuit.

11. The electric device of claim 1, wherein the microphone is a dynamic moving coil microphone, a condenser microphone, or a ribbon microphone.

* * * * *